United States Patent [19]

Vu et al.

[11] Patent Number: 4,924,116
[45] Date of Patent: May 8, 1990

[54] FEEDBACK SOURCE COUPLED FET LOGIC

[75] Inventors: Tho T. Vu, New Brighton, Minn.; Danh N. Tran, Irvine, Tex.

[73] Assignee: Honeywell Inc., Minneapolis, Minn.

[21] Appl. No.: 145,339

[22] Filed: Jan. 19, 1988

[51] Int. Cl.$^5$ .............................................. H03K 17/14
[52] U.S. Cl. .................................... 307/448; 307/450; 307/356; 307/554; 307/310
[58] Field of Search ................ 307/443, 448, 450, 475, 307/491, 494, 497, 501, 356, 553, 554, 562, 279, 310

[56] References Cited

U.S. PATENT DOCUMENTS

| | | | |
|---|---|---|---|
| 3,783,400 | 1/1974 | Gay | 307/299 X |
| 3,898,576 | 8/1975 | Fukaya | 330/28 |
| 3,997,850 | 12/1976 | Gundry | 330/25 |
| 4,074,150 | 2/1978 | Buckley, III et al. | 307/362 |
| 4,232,270 | 11/1980 | Marmet et al. | 330/253 |
| 4,276,515 | 6/1981 | Nishimoto | 330/253 |
| 4,462,002 | 7/1984 | Schade, Jr. | 330/253 |
| 4,661,725 | 4/1987 | Chantepie | 307/443 X |

FOREIGN PATENT DOCUMENTS

| | | | |
|---|---|---|---|
| 0208186 | 1/1987 | European Pat. Off. | 307/450 |
| 0023628 | 2/1984 | Japan | 307/450 |

OTHER PUBLICATIONS

Katsu et al., "A GaAs Monolithic Frequency Divider Using Source Coupled FET Logic", IEEE TELD, vol. EDL-3, No. 8, Aug. 1982, pp. 197–199.

Welbourn et al., "A High Speed GaAs 8 Bit Multiplexer Using Capacitor-Coupled Logic", IEEE JSSC, vol. SC-18, No. 3, Jun. 1983, pp. 359–364.

Zuleeg et al., "Femtojoule High-Speed Planar GaAs E-JFET Logic" IEEE TELD, vol. ED-25, No. 6, Jun. 1978, pp. 628–639.

Microelectronic Circuits, by Sedra & Smith (1982).

Primary Examiner—David Hudspeth
Attorney, Agent, or Firm—John G. Shudy, Jr.

[57] ABSTRACT

A feedback source coupled FET logic (FSCL) circuit having an internal reference voltage provided by the output of one FET of a pair of FET's, connected via a source follower FET to the input of the other FET of the pair. FSCL logic circuitry has advantages over known source coupled FET logic (SCFL) circuitry in that FSCL has higher density of functions for a given area of integrated circuitry, lower voltage drift with temperature change, higher voltage gain, higher noise margin, and larger fanout loading. The output of one FET, via a source follower FET, is connected to the input of the other FET of the pair.

7 Claims, 3 Drawing Sheets

FEEDBACK SOURCE COUPLED FET LOGIC

FIELD OF INVENTION

The present invention pertains to differential amplifiers and particularly to source coupled Field Effect Transistor (FET) logic gates having true and complement outputs. More particularly, the invention pertains to source coupled FET logic gates having feedback connections.

RELATED ART

Differential amplifiers and some applications of them to logic circuits are known in the art. Source coupled FET logic (SCFL) as implemented in differential amplifiers of logic circuits is known in the art as shown in FIG. 1. The latter circuits exhibit certain disadvantages including a low level of integration because of additional circuitry required to generate a reference voltage and of effects due to drifting voltage levels at varying high temperatures. The present invention obviates these disadvantages.

SUMMARY OF THE INVENTION

The present invention comprises feedback source coupled FET logic (FSCL), that is, an SCFL gate having a feedback path from an output to a voltage reference input. Additional circuitry is not needed to generate a reference voltage for the gate thus permitting a high level of circuit integration resulting in much higher chip density than that of conventional SCFL circuitry. The invention is self-thresholding with respect to inputs in that there is little voltage drifting with temperature change, which is a feature very desirable in high temperature applications. Also the invention has a noise to signal margin that is almost an order of magnitude better than conventional SCFL circuitry. The FSCL circuitry of the invention may be constructed with FET's of any type of process including depletion, enhancement, or a combination of depletion and enhancement FET's.

BRIEF DESCRIPTION OF THE DRAWINGS

FIG. 3b is a logic diagram of the circuit shown in FIG. 3a.

DETAILED DESCRIPTION OF THE PREFERRED EMBODIMENT

Figure 1:
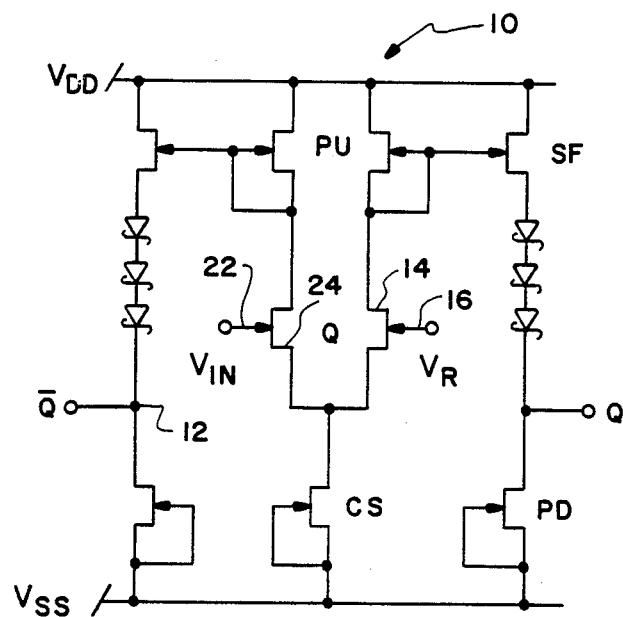
FIG. 1 is an SCFL gate of the related art.
Figure 2:
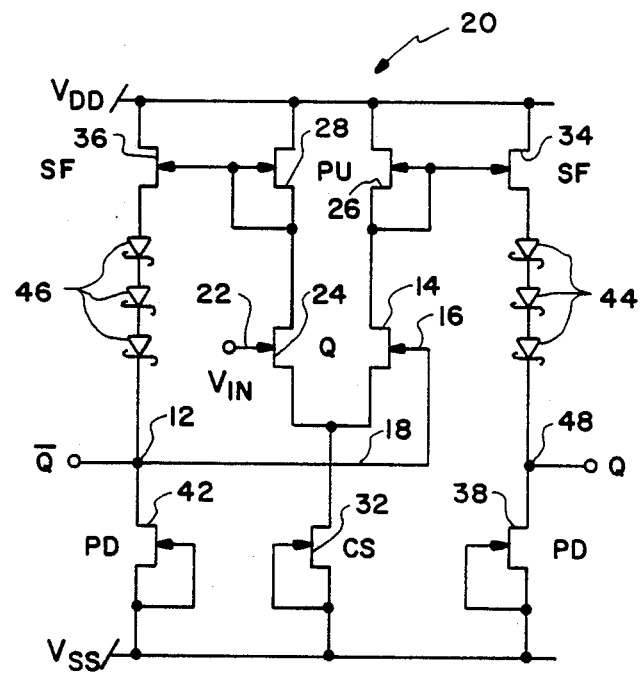
FIG. 2 is a gate incorporating the present invention.

The basic feature of the present invention 20 is illustrated in FIG. 2. A comparison of FIGS. 1 and 2 reveal a distinction which is an electrical connection 18 from node 12 to gate 16 of FET 14. FIG. 1 is an SCFL circuit which is a preferred circuit family for high speed digital systems. In FIG. 2, connection 18 is a feedback path from $\bar{Q}$ output at node 12 to $V_R$ (reference voltage) input 16. Connection 18 avoids the need to generate the reference voltage for each gate. The circuit, with the feedback path 18, is self-thresholding with respect to inputs 16 and 22, and thus resulting in negligible voltage drift with temperature variation. The reference voltage is regulated. The reference voltage is a threshold voltage or a switching point for the input voltage at input 22 of FET 24. FET's 14 and 24 are the essentials of a differential amplifier or comparator. FET's 14 and 24 are preferably enhancement mode FET's. FET's 26 and 28 are pull-up loads for input FET's 14 and 24, respectively. FET's 26 and 28 have their drains connected to a positive voltage $V_{DD}$ and have their gates and sources connected to the drains of input FET's 14 and 24, respectively. The sources of FET's 14 and 24 are connected to a drain of current sink FET 32. FET 32 has a gate and source connected to negative voltage $V_{SS}$. Voltages $V_{DD}$ and $V_{SS}$ either may be both positive or both negative, or one positive and one negative, or one may be a zero voltage; as long as $V_{DD}$ is sufficiently more positive than $V_{SS}$ as to allow circuit 20 to function appropriately. The drain of FET 14 is connected to the gate of source-follower FET 34. The drain of FET 24 is connected to the gate of source-follower FET 36. The source of FET 34 is connected to series-connected voltage-level shifting diodes 44 which in turn are connected to output node 48 and to the drain of pull-down FET 38. The source of FET 36 is connected to series-connected voltage-level shifting diodes 46 which in turn are connected to output node 12 and to the drain of pull-down FET 42. FET 38 has a gate and a source connected to voltage $V_{SS}$. FET 42 has a gate and a source connected to voltage $V_{SS}$.

As to the operation of the invention, as illustrated in FIG. 2, one may initially assume $V_{IN}$ at input 22 to be low or a logic "0". FET 24 is off an the drain of FET 24 is high or a logic "1", due to pull-up FET 28 connected to $V_{DD}$. The input to the gate of FET 36 is high and FET 36 is on with current flowing through diodes 46 resulting in a high or a logic "1" at node 12. The output $\bar{Q}$ at node 12 is the complement of signal Q at the input node 22. The high signal at node 12 is presented to input 16 by connection 18. FET 14 is thereby on resulting in a current flow through FET's 26 and 32. The drain of FET 14 and the gate of FET 34 are low. FET 34 is off and the output Q at node 48 is held low by pull-down FET 38. The output Q at output node 48 and input 22 are similarly low.

On the other hand, one may assume $V_{IN}$ at input 22 to go from a low to a high signal. The level at which FET 24 is effectively turned on is determined by the level of voltage at the sources of FET's 14 and 24 which in turn is determined by the reference voltage at gate 16 from connection 18. As the temperature of FET 24 varies, the switching threshold voltage remains constant because any variation of pinch-off voltage of FET 24 due to temperature variation is compensated for by variation of drain-to-gate voltage of FET 14 due to the same temperature variation. FET's 26, 28 and 32 are preferably depletion mode FET's.

The high signal at input 22 turns on FET 24 resulting in a low signal on the drain of FET 24 and on the gate of FET 36. FET 36 turns off and pull-down FET 42 pulls node 12 down resulting in a low signal on connection 18 and gate 16 of FET 14. FET 14 turns off with its drain going high and presenting a high signal to the gate of FET 34. FET 34 turns on thus resulting in node 48 going high with an output Q like input Q.

When $V_{IN}$ voltage at input 22 goes low, FET 24 is switched off at a point according to the level of the reference voltage at gate 16. Temperature variation has little effect on the voltage level requirement to switch FET 24. The voltage level at the sources of FET's 32 and 42 compensate for each other in that the variations of drain to source voltages are the same at given temperatures.

Figure 3A:
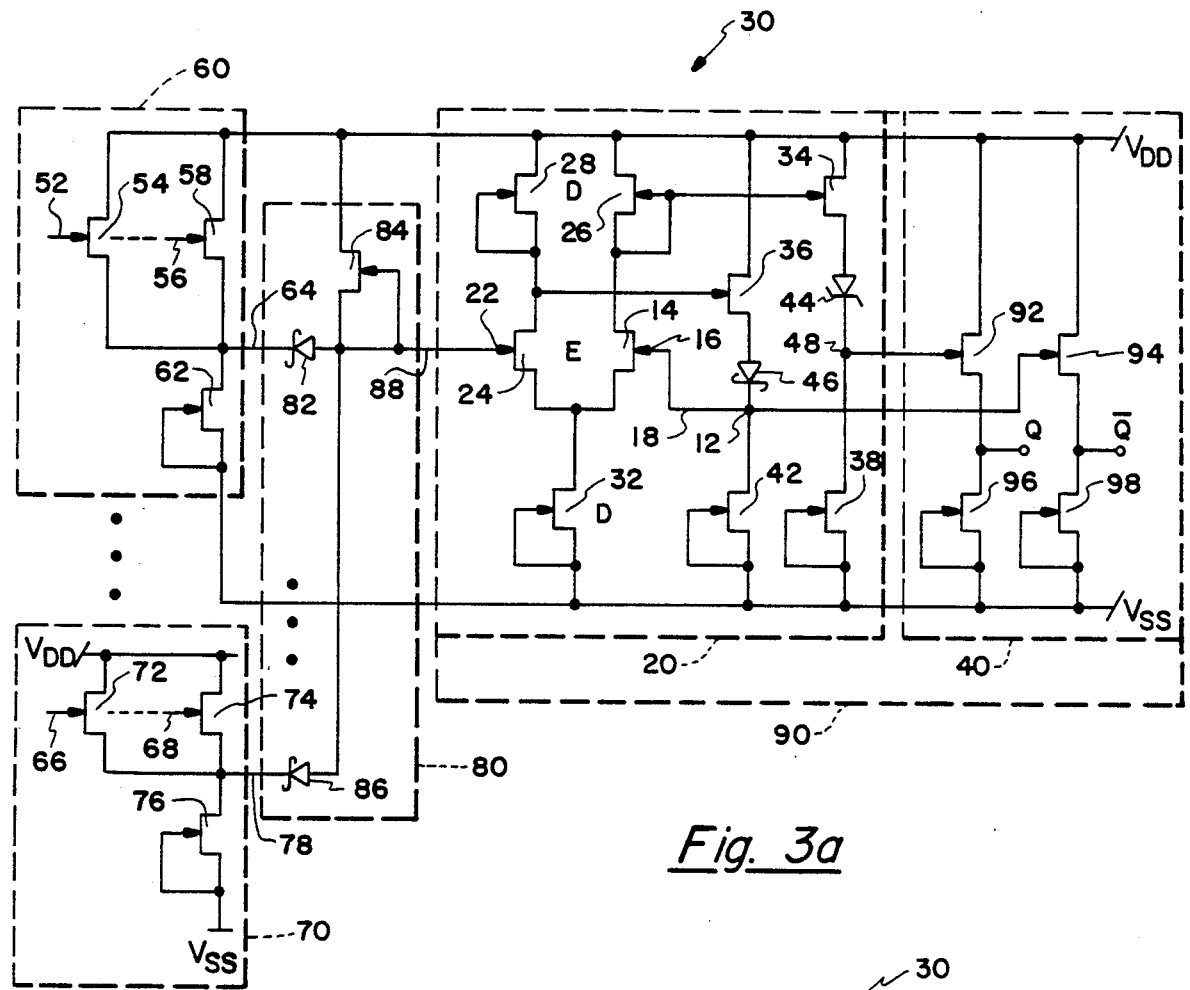
FIG. 3a is an FSCL OR/AND amplifier circuit incorporating the present invention.
Figure 3B:
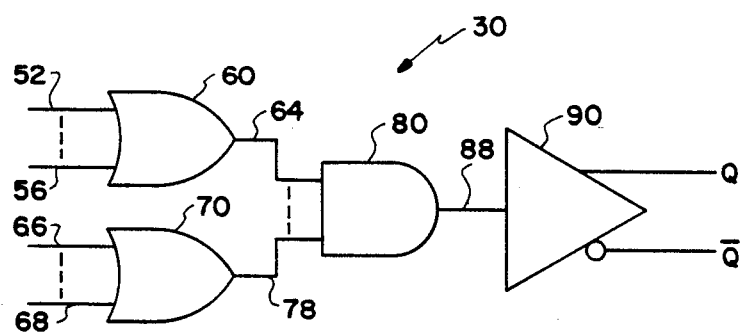

The present invention may be extended or applied to logic circuitry 30 of FIGS. 3a and 3b. FIG. 3a illustrates a realization of the invention (FSCL) in a multiple input OR/AND gate 30. FIG. 3b is a logic diagram of the schematic of FIG. 3a. Since the feedback SCFL provides only one self-reference voltage level, other reference levels are still needed in the case of making an R-S flip-flop or an exclusive OR circuit using a series-gating approach. FIG. 3a shows another option to implement multi-level logic in this FSCL to perform logical functions at the front end without using any reference voltages.

Inputs 52 through 56 are connected to gates of FET's 54 through 58. FET's 54 through 58 have their drains connected together and their sources connected together. The drains are connected to voltage $V_{DD}$ as defined above. The sources are connected to the drain of pull-down FET 62. The gate and source of FET 62 are connected to voltage $V_{SS}$ as defined above. Line 64 is the output which is the disjunction or logic OR result of inputs 52 through 56 of OR gate 60.

Inputs 66 through 68 are connected to gates of FET's 72 through 74. FET's 72 through 74 have their drains connected together and their sources connected together. The drains are connected to $V_{DD}$ as defined above. The sources are connected to the drain of pull-down FET 76. The gate and source of FET 76 are connected to voltage $V_{SS}$ as defined above. Line 78 is the output which is the disjunction or logic OR result of inputs 66 through 68 of OR gate 70.

Gates 60 and 70 are only two of a multitude of OR gates represented by FIGS. 3a and 3b. The outputs 64 through 78 are connected to the inputs of AND gate 80. Output 64 is connected to the cathode of Schottky diode 82 and output 78 is connected to the cathode of Schottky diode 86. The other outputs of the remaining multitude of OR gates are respectively connected to cathodes of Schottky diodes. The anodes of all Schottky diodes 82 through 86 are connected to line 88. Line 88 is connected to the base and source of pull-up FET 84 which has a drain connected to voltage $V_{DD}$. Line 88 is the output of AND gate 80 and is the conjunction or logic AND result of lines 64 through 74. Line 88 is connected to the FSCL gate amplifier-driver 90.

FSCL gate amplifier-driver 90 in FIGS. 3a and 3b comprises FSCL circuit 20 of FIG. 2 and FET source follower driver 40. FSCL circuit 20 is described above. Source follower driver 40 is optional and incorporated as a current driver in applications having high capacitance loading. The Q output at node 48 goes into the gate of source follower FET 92. The drain of FET 92 is connected to voltage $V_{DD}$ and the source of FET 92 is connected to the drain of pull-down FET 96. The gate and source of FET 96 are connected to voltage $V_{SS}$. The Q output of driver 40 is connected to the source of FET 92. The $\overline{Q}$ output at node 12 goes into the gate of source follower FET 94. The drain of FET 94 is connected to voltage $V_{DD}$ and the source of FET 94 is connected to the drain of pull-down FET 98. The gate and source of FET 98 are connected to voltage $V_{SS}$. The $\overline{Q}$ output of driver 40 is connected to the source of FET 94. The above circuit is preferably implemented in gallium arsenide (GaAs) integrated circuit technology.

Figure 4A:
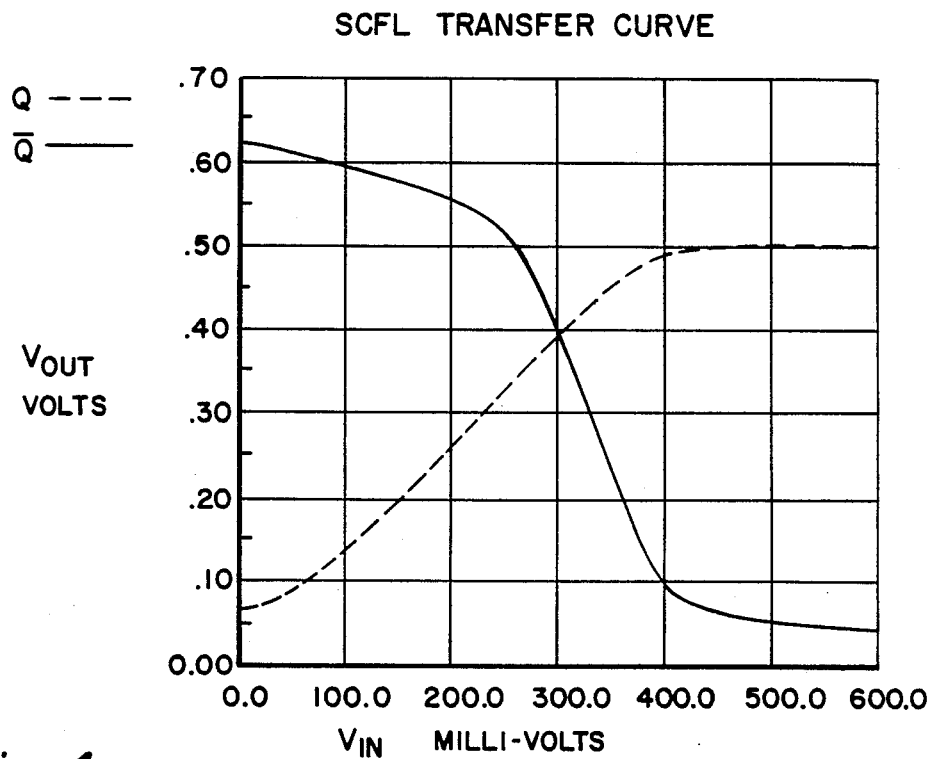
FIG. 4a is a graph of an SCFL transfer curve.
Figure 4B:
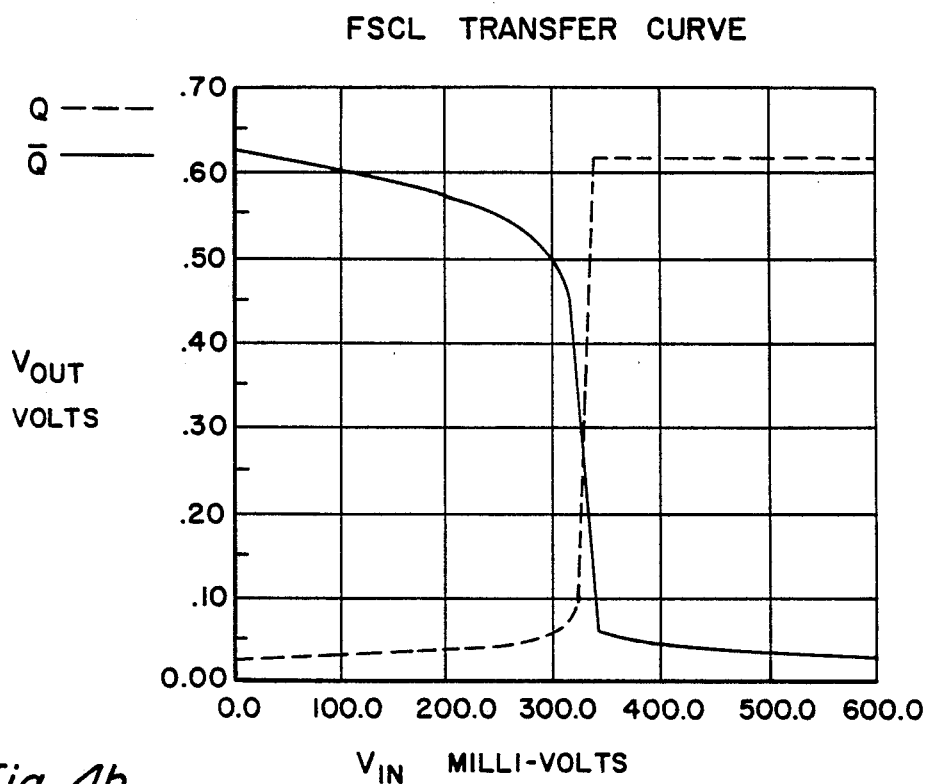
FIG. 4b is a graph of an FSCL transfer curve.

FIGS. 4a and 4b show simulated direct circuit (DC) transfer curves of SCFL (FIG. 1) and FSCL (FIG. 2) respectively, at nominal temperature. FIG. 4a (SCFL) shows a reference voltage of 0.4 volt at the cross-over point of Q and $\overline{Q}$, at an input voltage of 0.3 volt. A point of Q or $\overline{Q}$ above 0.4 volt represents a logic 1 or high and such point below 0.4 volt represents a logic 0 or low. The voltage gain of the SCFL circuit is:

$$A_V = V_{OUT}/V_{IN} = 0.60/0.15 = 4$$

FIG. 4b (FSCL) shows a reference or threshold voltage of 0.3 volt at the cross-over point of Q and $\overline{Q}$, at an input voltage of 0.33 volt. A point above 0.3 volt represents a logic 1 or high and such point below 0.3 volt represents a logic 0 or low. The levels for high and low signals are much more distinct and stable for FSCL circuitry than for SCFL circuitry. The voltage gain of the FSCL circuit is:

$$A_V = V_{OUT}/V_{IN} = 0.60/0.02 = 30$$

This high voltage gain is a very much desired advantage for a high noise margin circuit.

TABLE 1

SIMULATED RESULTS OF SCFL IN DEPLETION MODE GaAs I (Q OUTPUT)

| PU (um²) | Q,SF,PD (um²) | CS (um²) | $V_H$ (V) | $V_L$ (V) | $V_{SW}$ (V) |
|---|---|---|---|---|---|
| L × W | | | | | |
| 1 × 20 | 1 × 30 | 1 × 60 | 0.630 | 0.016 | 0.600 |
| 1 × 10 | 1 × 15 | 1 × 30 | 0.850 | 0.041 | 0.810 |
| 1 × 5 | 1 × 7.5 | 1 × 15 | 1.050 | 0.010 | 0.950 |

| P (mw) | $t_R$ (ns) | $t_F$ (ns) | $t_{ON}$ (ns) | $t_{OFF}$ (ns) | $t_{PD}$ (ns) |
|---|---|---|---|---|---|
| 18.50 | 0.15 | 0.15 | 0.13 | 0.12 | 0.125 |
| 10.10 | 0.18 | 0.21 | 0.13 | 0.11 | 0.120 |
| 5.32 | 0.18 | 0.21 | 0.13 | 0.11 | 0.120 |

TABLE 2

SIMULATED RESULTS OF FSCL IN DEPLETION MODE GaAs I (Q OUTPUT)

| PU (um²) | Q,SF,PD (um²) | CS (um²) | $V_H$ (V) | $V_L$ (V) | $V_{SW}$ (V) |
|---|---|---|---|---|---|
| L × W | | | | | |
| 1 × 20 | 1 × 30 | 1 × 60 | 0.616 | 0.016 | 0.600 |
| 1 × 10 | 1 × 15 | 1 × 30 | 0.860 | 0.040 | 0.820 |
| 1 × 5 | 1 × 7.5 | 1 × 15 | 1.025 | 0.050 | 0.970 |

| P (mw) | $t_R$ (ns) | $t_F$ (ns) | $t_{ON}$ (ns) | $t_{OFF}$ (ns) | $t_{PD}$ (ns) |
|---|---|---|---|---|---|
| 18.10 | 0.23 | 0.21 | 0.17 | 0.13 | 0.150 |
| 9.78 | 0.21 | 0.21 | 0.17 | 0.13 | 0.150 |
| 5.20 | 0.15 | 0.21 | 0.15 | 0.13 | 0.140 |

TABLE 3

SIMULATED RESULTS OF SCFL IN ENHANCEMENT MODE GaAs II (Q OUTPUT)

| PU (KΩ) | CS,PD (KΩ) | Q,SF (um²) | $V_H$ (V) | $V_L$ (V) | $V_{SW}$ (V) |
|---|---|---|---|---|---|
| | | L × W | | | |
| 5 | 10 | 2 × 20 | −1 | −1.97 | 0.97 |
| 10 | 20 | 2 × 10 | −1 | −1.97 | 0.97 |
| 20 | 40 | 2 × 5 | −1 | −1.97 | 0.97 |

| P (mw) | $t_R$ (ns) | $t_F$ (ns) | $t_{ON}$ (ns) | $t_{OFF}$ (ns) | $t_{PD}$ (ns) |
|---|---|---|---|---|---|
| 3.300 | 0.26 | 0.26 | 0.14 | 0.12 | 0.13 |
| 1.655 | 0.26 | 0.26 | 0.14 | 0.12 | 0.13 |

TABLE 3-continued
SIMULATED RESULTS OF SCFL IN ENHANCEMENT MODE GaAs II (Q OUTPUT)

| 0.827 | 0.26 | 0.26 | 0.14 | 0.12 | 0.13 |
|---|---|---|---|---|---|

TABLE 4
SIMULATED RESULTS OF FSCL IN ENHANCEMENT MODE GaAs II (Q OUTPUT)

| PU (KΩ) | CS,PD (KΩ) | Q,SF (um²) × W | $V_H$ (V) | $V_L$ (V) | $V_{SW}$ (V) |
|---|---|---|---|---|---|
| 5 | 10 | 2 × 20 | −1.06 | −1.94 | 0.88 |
| 10 | 20 | 2 × 10 | −1.06 | −1.94 | 0.88 |
| 20 | 40 | 2 × 5 | −1.06 | −1.94 | 0.88 |

| P (mw) | $t_R$ (ns) | $t_F$ (ns) | $t_{ON}$ (ns) | $t_{OFF}$ (ns) | $t_{PD}$ (ns) |
|---|---|---|---|---|---|
| 3.400 | 0.26 | 0.26 | 0.28 | 0.28 | 0.28 |
| 1.670 | 0.26 | 0.26 | 0.28 | 0.28 | 0.28 |
| 0.847 | 0.26 | 0.26 | 0.28 | 0.28 | 0.28 |

Figure 5:
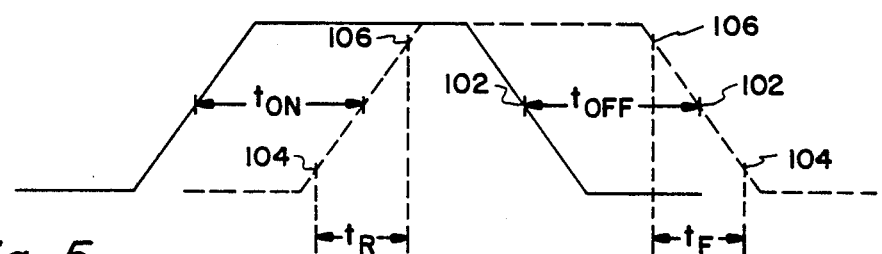
FIG. 5 is a timing diagram illustrating various measured parameters in Tables 1 through 4.

Tables 1 through 4 reveal simulated results of SCFL and FSCL circuitry. Tables 1 and 2 present results of GaAs SCFL and FSCL circuits using depletion mode (GaAs I) FET's along with the scaling of device size and power. Tables 3 and 4 present results of SCFL and FSCL circuits using enhancement mode (GaAs II) FET's along with the scaling of device size and power. The first column of Tables 1 and 2 shows the various areas of the pull-up (PU) FET's. The second column states the various areas in square micrometers for the different switching (Q) FET's, source-follower (SF) FET's, and pull-down (PD) FET's. In the third column are the various areas for the current-sink (CS) FET. The first and second columns of Tables 3 and 4 indicate resistances in kilo-ohms of the loads presented by the PU, CS and PD FET's, respectively. The third column of Tables 3 and 4 indicates the various areas in square micrometers of the Q and SF FET's. The other columns from left to right for all four tables reveal high and low voltages, swing voltage, power in milliwatts, and rise time, fall time, times to turn on and off, and average on and off switching time ($t_{PD}=(t_{ON}+t_{OFF})/2$) in nanoseconds. The swing voltage ($V_{SW}$) generally equals $V_H-V_L$. FIG. 5 illustrates the measurement of various time parameters for Tables 1 through 4, such as times to turn on ($t_{ON}$) and off ($t_{OFF}$), and rise ($t_R$) and fall ($t_F$) times. The $t_{ON}$ and $t_{OFF}$ times are measured at midpoint 102 of the voltage amplitude change. The $t_R$ and $t_F$ times are measured at the 10% points 104 and the 90% points 106 of the voltage waveform amplitude.

In summary, the tables reveal that the FSCL circuit with its own internal reference voltage performs with approximately the same power requirements and nearly the same speed as the SCFL circuit for a given size chip area, not including the area required to provide the required reference voltage for the SCFL circuit. Thus the FSCL circuit has a much higher level of chip integration than that of the SCFL circuit because of the additional circuitry required to generate the SCFL reference voltage, thereby increasing high yield processes for manufacturing FSCL integrated circuits.

FSCL circuit 20 has a much higher signal to noise margin than conventional SCFL circuitry. The temperature compensation of FSCL circuit 20 is much superior than the temperature compensation of the conventional SCFL circuitry. FSCL circuit 20 has a push-pull option 40 at the output (12 and 48) for high fanout loading. (See FIG. 3a).

The FSCL circuit may be made with FET's using any type of process including depletion, enhancement, or a combination of processes. FSCL circuit 20 using both depletion and enhancement FET's requires only one power supply voltage ($V_{DD}$) having a ground reference ($V_{SS}$).

The FSCL circuit is applicable to any solid state semiconductor materials for high speeds and high levels of circuit integration. The FSCL circuit may be implemented in integrated circuit technology comprising a material of a group consisting of gallium arsenide, silicon, and indium phosphide. FSCL circuitry is applicable to flip-flops, latches, Schmitt triggers, voltage comparators, programmable logic arrays, memories, registers, clocks, processors, and so on.

The following is claimed:

1. A feedback source coupled FET logic circuit comprising:
   a first FET having a drain, a gate and a source;
   a second FET having a source connected to the source of said first FET, having a drain and having a gate;
   a third FET having a gate connected to the drain of said second FET, having a drain and having a source;
   a first voltage level shifter having an anode connected to the source of said third FET and having a cathode connected to the gate of said first FET;
   a first current source connected to the drain of said first FET;
   a second current source connected to the drain of said second FET;
   a first current sink connected to the source of said first FET;
   a second current sink connected to the cathode of said first voltage level shifter;
   an input terminal connected to the gate of said second FET;
   a first output terminal connected to the cathode of said first voltage level shifter;
   a fourth FET having a gate connected to the drain of said first FET, having a drain, and having a source;
   a second voltage level shifter having an anode connected to the source of said fourth FET, and having a cathode;
   a third current sink connected to the cathode of said second voltage level shifter;
   a second output terminal connected to the cathodes of said second voltage level shifter; and wherein
   said first voltage level shifter comprises at least one diode;
   said second voltage level shifter comprises at least one diode;
   said first current source comprises a fifth FET having a gate and a source connected to the drain of said first FET, and having a drain;
   said second current source comprises a sixth FET having a gate and a source connected to the drain of said second FET, and having a drain;
   said first current sink comprises a seventh FET having a drain connected to the source of said first FET, having a gate, and having a source connected to the gate of said seventh FET;
   said second current sink comprises an eighth FET having a drain connected to the cathode of said first voltage level shifter, having a gate, and having a source connected to the gate of said eighth FET;

said third current sink comprises a ninth FET having a drain connected to the cathode of said second voltage level shifter, having a gate, and having a source connected to the gate of said ninth FET;

said first voltage level shifter, having the cathode connected to the gate of said first FET, provides a reference voltage to the gate of said first FET; and said circuit comprises Schottky diodes and metal semiconductor FET's implemented in integrated circuit technology comprising a material of a group consisting of gallium arsenide, silicon, and indium phosphide.

2. Apparatus of claim 1 wherein:

the drain of said third FET is connected to a first voltage terminal of a power supply;

the drain of said fourth FET is connected to the first voltage terminal of the power supply;

the drain of said fifth FET is connected to the first voltage terminal of the power supply;

the drain of said sixth FET is connected to the first voltage terminal of the power supply;

the source of said seventh FET is connected to a second voltage terminal of the power supply;

the source of said eighth FET is connected to the second voltage terminal of the power supply;

the source of said ninth FET is connected to the second voltage terminal of the power supply; and the first voltage terminal of the power supply has a voltage potential sufficiently more positive than a voltage potential of the second voltage terminal of the power supply, to enable satisfactory functioning of said feedback source coupled FET logic circuit.

3. Apparatus of claim 2 wherein said circuit is implemented in gallium arsenide integrated circuit technology.

4. Apparatus of claim 3 wherein:

said first and second FET's are enhancement mode FET's; and said fifth, sixth and seventh FET's are depletion mode FET's.

5. Apparatus of claim 3 further comprising:

a plurality of diodes having anodes connected to the gate of said second FET, and wherein cathodes of are inputs for signals which result in a AND signal of the signals, at the gate of said second FET; and a tenth FET having a gate and a source both connected to the gate of said second FET and having a drain connected to the first voltage terminal of the power supply.

6. Apparatus of claim 5 further comprising:

a plurality of groups of FET's wherein each group of FET's has sources connected to a cathode of a diode of said plurality of diodes, has drains connected to the first voltage terminal of the power supply, and has gates wherein each gate is an input for a signal and the input signals of the gates of said each group of FET's result in an OR signal at the cathode of the respective diode of said plurality of diodes; and a plurality of FET's wherein each FET corresponds to said each group of FET's, each FET of said plurality of FET's having a gate and a source both connected to the second voltage terminal of the power supply and having a drain connected to the sources of the respective group of FET's.

7. Apparatus of claim 3 further comprising:

an eleventh FET having a gate connected to the cathode of said second voltage level shifter, having a drain connected to the first voltage terminal of the power supply, and having a source;

a twelfth FET having a gate connected to the cathode of said first voltage level shifter, having a drain connected to the first voltage terminal of the power supply, and having a source;

a thirteenth FET having a drain connected to the source of said eleventh FET, and having a gate and a source both connected to the second voltage terminal of the power supply;

a fourteenth FET having a drain connected to the source of said twelfth FET, and having a gate and a source both connected to the second voltage terminal of the power supply;

a third output terminal connected to the source of said eleventh FET; and a fourth output terminal connected to the source of said twelfth FET.

* * * * *